United States Patent
Tsujikawa

(10) Patent No.: US 10,120,294 B2
(45) Date of Patent: Nov. 6, 2018

(54) LITHOGRAPHY APPARATUS AND ARTICLE MANUFACTURING METHOD

(71) Applicant: CANON KABUSHIKI KAISHA, Tokyo (JP)

(72) Inventor: Takuro Tsujikawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 106 days.

(21) Appl. No.: 14/937,012

(22) Filed: Nov. 10, 2015

(65) Prior Publication Data
US 2016/0139513 A1 May 19, 2016

(30) Foreign Application Priority Data
Nov. 18, 2014 (JP) ................................ 2014-234000

(51) Int. Cl.
*G01B 11/00* (2006.01)
*G03F 9/00* (2006.01)

(52) U.S. Cl.
CPC ................... *G03F 9/7046* (2013.01)

(58) Field of Classification Search
CPC ..... G03B 27/42; G03F 9/7011; G03F 9/7084; G03F 9/7046
USPC ................................................ 356/399–401
See application file for complete search history.

(56) References Cited

U.S. PATENT DOCUMENTS

| | | | | |
|---|---|---|---|---|
| 6,930,016 B2* | 8/2005 | Mishima | ............... | G03F 9/7046 250/498.1 |
| 7,336,352 B2* | 2/2008 | Tanaka | .................. | G03F 9/7003 356/306 |
| 2003/0053060 A1* | 3/2003 | Kim | ...................... | H01L 23/544 356/401 |
| 2004/0169833 A1* | 9/2004 | Tanaka | .................. | G03B 27/42 355/53 |
| 2004/0189995 A1* | 9/2004 | Tanaka | .................. | G03F 9/7003 356/401 |
| 2009/0219533 A1* | 9/2009 | Hayashi | ................ | G03F 9/7003 356/401 |
| 2010/0271609 A1* | 10/2010 | Tsujikawa | .............. | G01B 11/03 355/67 |
| 2013/0230805 A1* | 9/2013 | Yamaguchi | ......... | H01J 37/3174 430/296 |

FOREIGN PATENT DOCUMENTS

JP 2010258009 A 11/2010

* cited by examiner

*Primary Examiner* — Isiaka Akanbi
(74) *Attorney, Agent, or Firm* — Rossi, Kimms & McDowell LLP

(57) ABSTRACT

A lithography apparatus includes: a stage configured to hold a substrate on which a mark is formed; an image sensor having an image sensing region; a processor configured to read out data concerning an image of the mark on a row basis to obtain a position of the mark; and a controller configured to position the substrate based on the position of the mark. When the processor obtains a position of a first mark on a first substrate, the controller moves the stage with respect to the image sensor such that an image of the first mark is formed closer to a row, from which the processor starts readout of the data, than an image of a second mark on a second substrate on which the pattern has been formed prior to the first substrate.

12 Claims, 9 Drawing Sheets

LITHOGRAPHY APPARATUS AND ARTICLE MANUFACTURING METHOD

BACKGROUND OF THE INVENTION

Field of the Invention

The present invention relates to a lithography apparatus that positions a substrate and forms a pattern on the substrate, and an article manufacturing method.

Description of the Related Art

In a semiconductor manufacturing process, lithography processing of forming a pattern on a wafer using a lithography apparatus such as an exposure apparatus is performed. In the lithography processing, process time shortening is required in addition to accuracy improvement. Hence, there is also a demand for shortening a measurement time needed for wafer alignment measurement.

Japanese Patent Laid-Open No. 2010-258009 describes performing readout based on the information of the size and starting point of an alignment mark region portion to shorten the measurement time by decreasing the transfer amount of data from an image sensor that has detected an alignment mark formed on a wafer.

In the technique of Japanese Patent Laid-Open No. 2010-258009, data processing is started without reading out the data of a portion after the alignment mark region portion in the image sensing region of the image sensor, thereby calculating the position of the alignment mark. This shortens the measurement time, as compared to a case where the data of the entire image sensing region is read out.

However, when measuring the position of an alignment mark, the substrate is normally positioned with respect to the image sensor such that the alignment mark is located at the center of the image sensing region. Hence, data not to be used to calculate the position of the alignment mark exists between the readout starting point of the entire image sensing region and the readout starting point of the alignment mark region portion.

In Japanese Patent Laid-Open No. 2010-258009, the data of the alignment mark region portion cannot be processed without reading out the data not to be used to calculate the position of the alignment mark and the data of the alignment mark region portion to be used for the calculation. As a result, measuring the position of the alignment mark takes time.

SUMMARY OF THE INVENTION

The present invention provides a lithography apparatus that reduces the time needed to measure the position of an alignment mark.

The present invention provides a lithography apparatus for forming a pattern on a substrate, the apparatus comprising: a stage configured to move while holding the substrate on which a mark is formed; an image sensor having an image sensing region in which a plurality of pixels are arranged in matrix; a processor configured to read out data concerning an image of the mark formed in the image sensing region sequentially on a row basis and process the readout data, thereby obtaining a position of the mark formed on the substrate; and a controller configured to position the substrate by moving the stage based on the position of the mark and form the pattern on the substrate, wherein when the processor obtains a position of a first mark on a first substrate, the controller moves the stage with respect to the image sensor such that an image of the first mark is formed closer to a row in the image sensing region, from which the processor starts readout of the data, than an image of a second mark on a second substrate on which the pattern has been formed prior to the first substrate.

Further features of the present invention will become apparent from the following description of exemplary embodiments with reference to the attached drawings.

DESCRIPTION OF THE EMBODIMENTS

[Exposure Apparatus]

A lithography apparatus for forming a pattern on a substrate by irradiating it with an energy line will be described below with reference to the accompanying drawings. In this embodiment, a case where an exposure apparatus is used as the lithography apparatus will be described. However, a lithography apparatus other than an exposure apparatus, for example, an imprint apparatus or a charged particle beam drawing apparatus is also usable.

Figure 1:
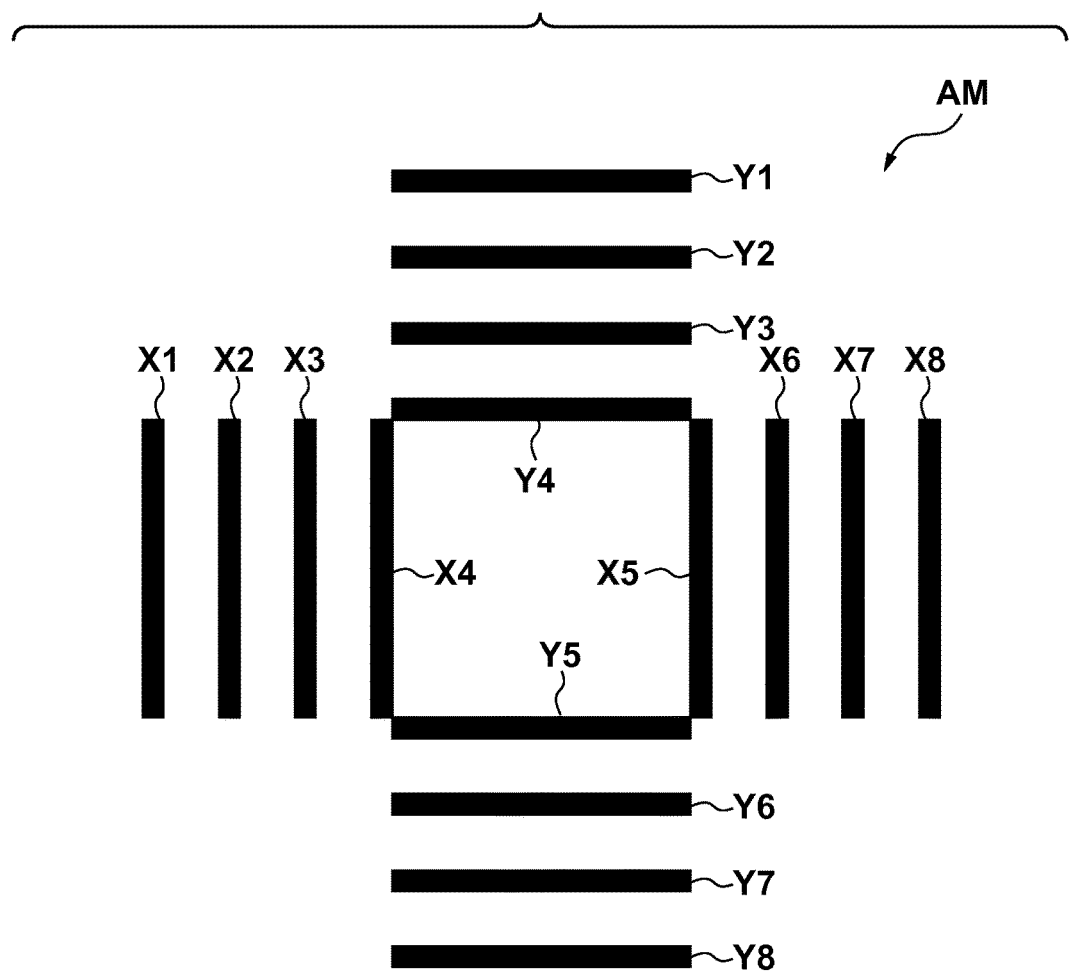
FIG. 1 is a view showing an alignment mark.

A form of an alignment mark will be described with reference to FIG. 1. An alignment mark (mark) AM shown in FIG. 1 includes eight X-direction measurement marks X1 to X8 and eight Y-direction measurement marks Y1 to Y8. Global alignment measurement is performed using the mark AM as a measurement target, thereby obtaining the X- and Y-positions of the mark AM on a substrate (wafer) W. Global alignment measurement includes prealignment measurement and fine alignment measurement. In prealignment measurement, the two-dimensional arrangement of the 16 measurement marks of the mark AM in at least one shot region is recognized by pattern matching using a detector of a low magnification (first magnification), thereby simultaneously calculating the X- and Y-direction positions of the mark AM. In fine alignment measurement, positions more precise than in the prealignment measurement are detected concerning the marks AM in a plurality of shot regions using a detector of a high magnification (second magnification). The positions of the plurality of marks AM obtained from the image sensing result of the fine alignment measurement are statistically processed, thereby calculating the positions of all shot regions on the substrate.

Figure 2:
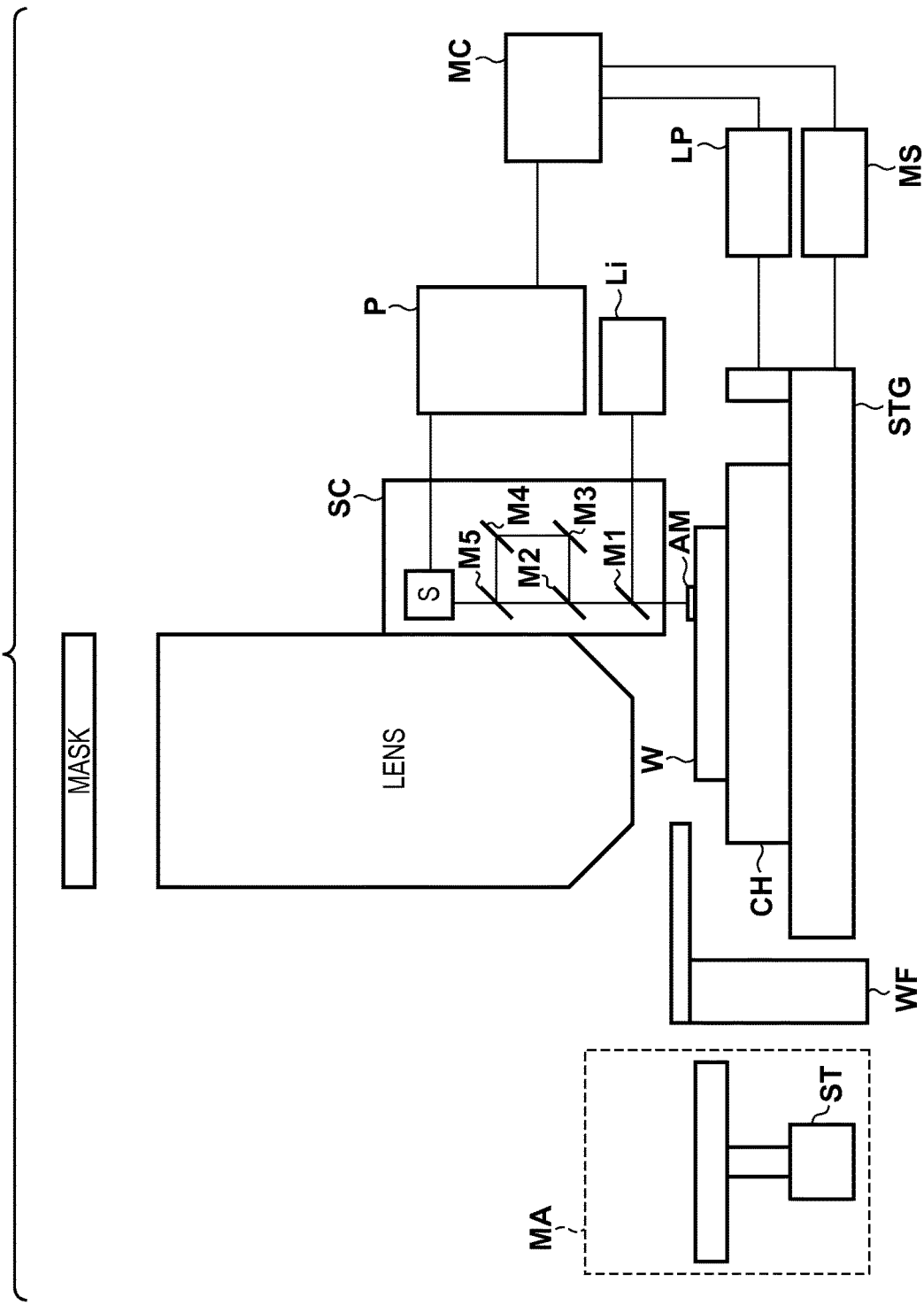
FIG. 2 is a view showing an exposure apparatus according to the present invention.
Figure 3:
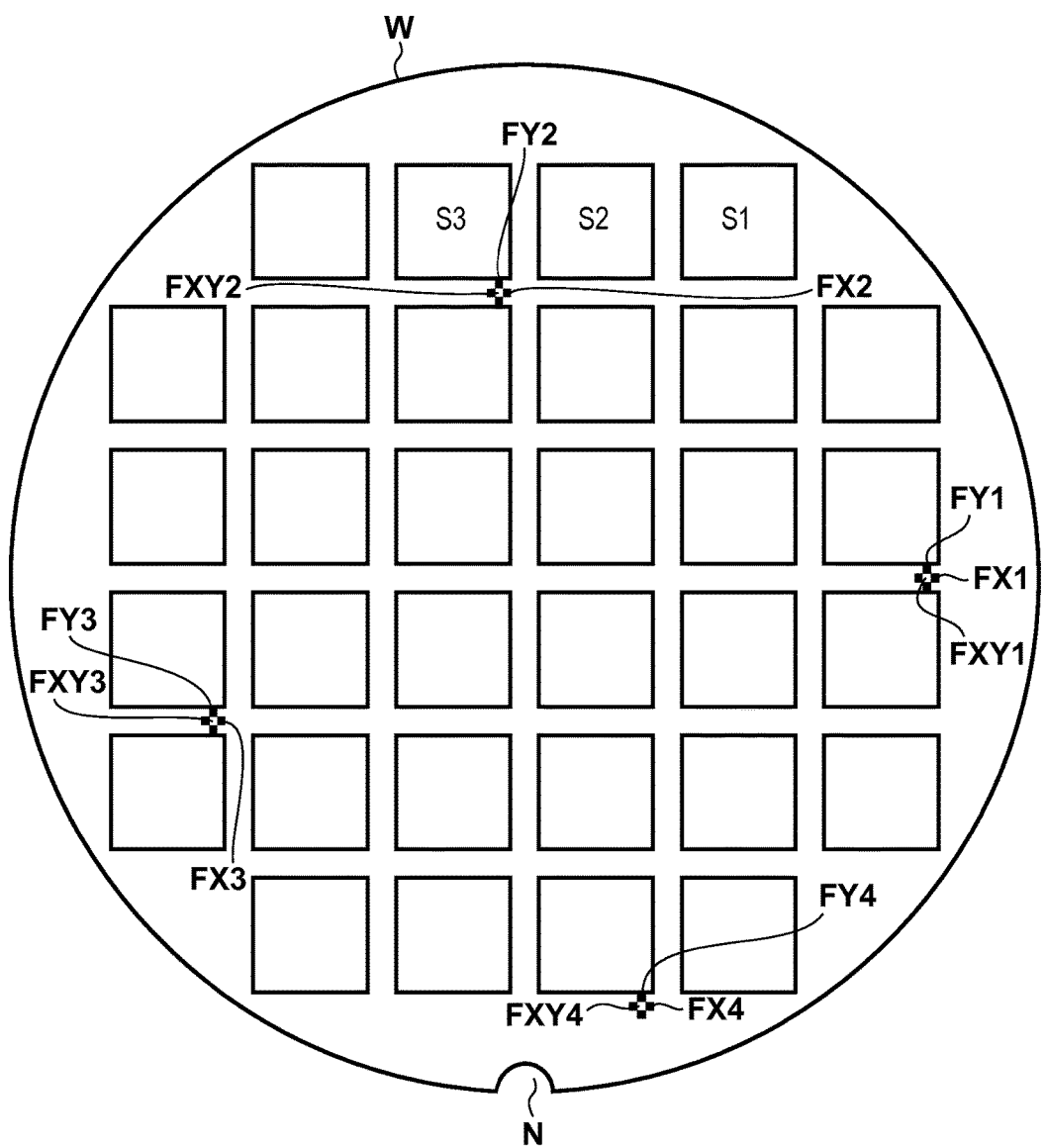
FIG. 3 is a view showing a substrate on which alignment marks are formed.

A detector (scope) that observes the mark AM shown in FIG. 1 using two magnifications different from each other, that is, a low magnification and a high magnification will be described with reference to FIG. 2. Illumination light is guided from a light source Li into a scope SC, passed through a half mirror (or polarizing beam splitter) M1, and illuminates the mark AM on the substrate (wafer) W. The mark AM as the observation target is assumed to be, for example, a mark FXY1 shown in FIG. 3. In low magnification measurement, the light reflected by the wafer W passes through the half mirrors M1 and M5 and reaches an image sensor S. At this time, a switching mirror M2 is off the optical path. In high magnification measurement, the switching mirror M2 is inserted onto the optical path. Hence, after passing through the half mirror M1, the light reflected by the wafer W is guided to the path of a mirror M3, a mirror M4, and the half mirror M5 and reaches the image sensor S. The image sensor S has an image sensing region in which a plurality of pixels are arranged in matrix. An optical system formed from the half mirror M1, the mirror M3, the mirror M4, and the half mirror M5 forms the image of the mark AM on the image sensing region of the image sensor S. A processor P sequentially reads out data from the image sensing region on a row basis from the readout starting row, processes the data of the image of the mark FXY1 in the readout data, and decides the position of the mark FXY1. A main controller (controller) MC sends a control signal to a driver MS so as to drive a stage STG based on measurement result information from the processor P, measurement information of the position of the stage STG from a sensor LP, and the like.

Figure 4:
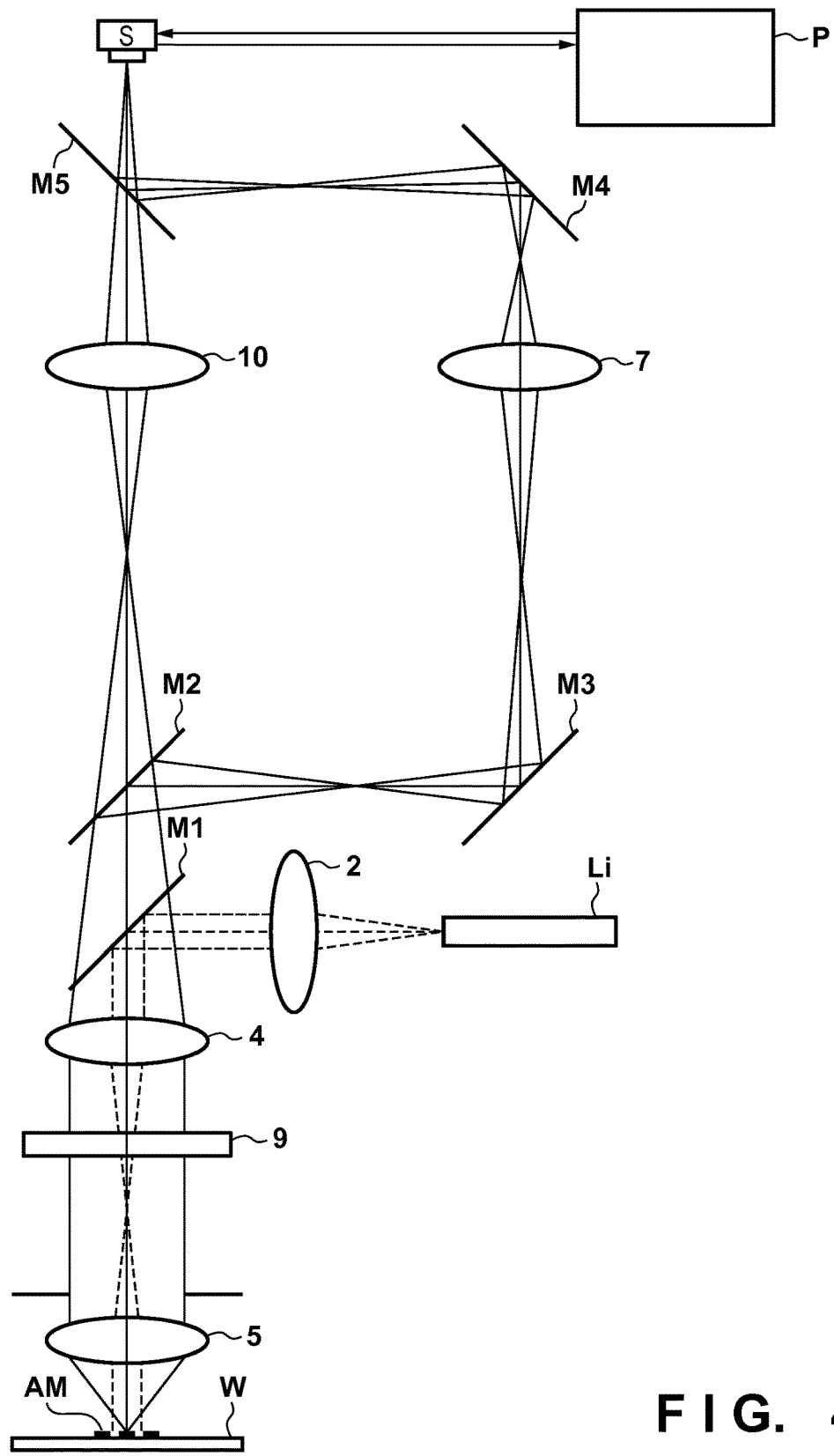
FIG. 4 is a view showing a scope.

Low magnification measurement and high magnification measurement will be described with reference to FIG. 4. The illumination optical system is shared by the low magnification measurement and the high magnification measurement. Illumination light is guided from the light source Li into the scope SC by an illumination optical system 2 and then guided to the polarizing beam splitter M1. The illumination light illuminates the mark AM on the wafer W, for example, the mark FXY1 shown in FIG. 3. S-polarized light reflected by the polarizing beam splitter M1, which is perpendicular to the drawing surface, passes through a relay lens 4 and a λ/4 plate 9 and is then converted into circularly polarized light. The circularly polarized light passes through an objective lens 5 and Koehler-illuminates the mark AM formed on the wafer W. Reflected light, diffracted light, and scattered light generated from the mark AM on the wafer W return via the objective lens 5 and the λ/4 plate 9 again and are converted into p-polarized light parallel to the drawing surface. The p-polarized light passes through the polarizing beam splitter M1.

In low magnification measurement, the magnification switching mirror M2 is off the optical path. Hence, the reflected light and the like are guided to an imaging optical system 10 for low magnification measurement, pass through the half mirror M5, and form the image of the mark AM on the image sensor (sensor, photoelectric conversion element, or variable accumulation time camera) S. The processor P detects the position of the mark AM and positions the wafer W based on the position of the photoelectrically converted mark image. In high magnification measurement, the magnification switching mirror M2 is inserted onto the optical path. Hence, the reflected light and the like are guided to the mirror M3 and an imaging optical system 7 for high magnification measurement, pass through the mirror M4 and the half mirror M5, and form the image of the mark AM on the image sensor S. The processor P detects the position of the mark AM based on the position of the photoelectrically converted mark image. The main controller MC forms a pattern while positioning the wafer W based on the detected position of the mark AM.

Figure 5A:
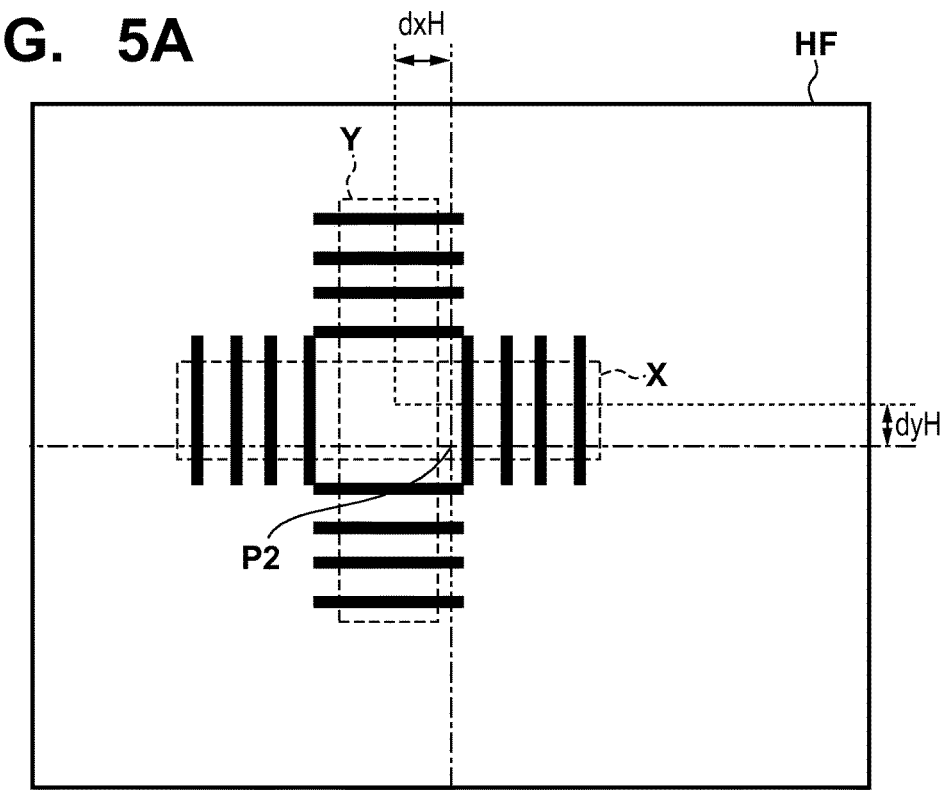
FIGS. 5A and 5B are views showing states in which the alignment mark shown in FIG. 1 is observed.
Figure 5B:
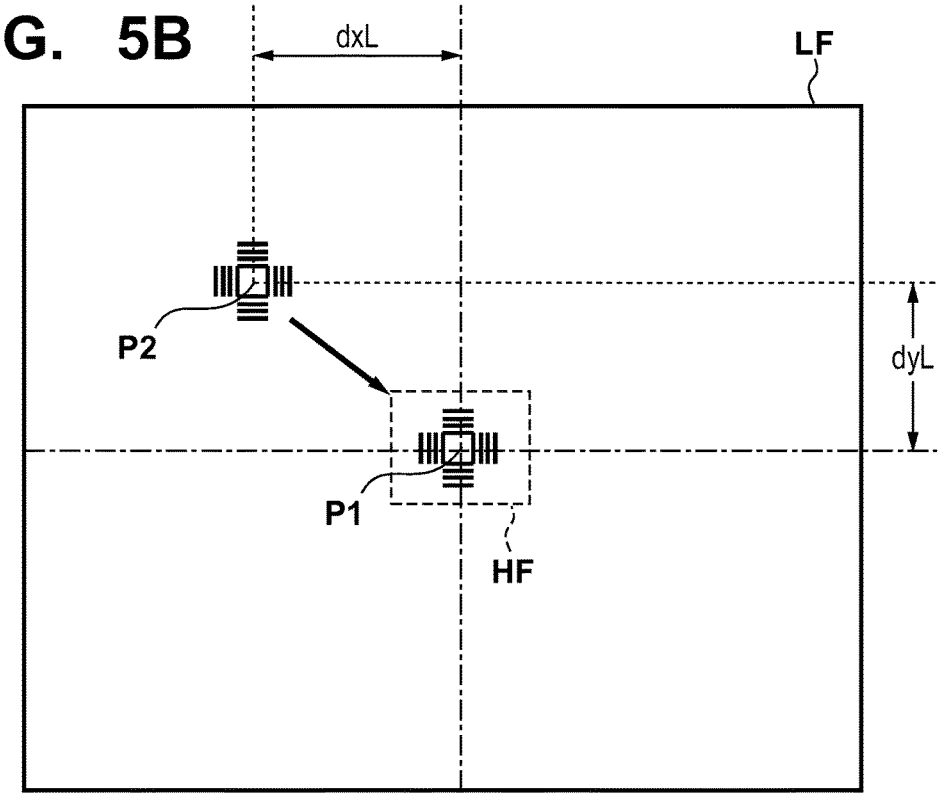

The imaging optical systems 7 and 10 will be described with reference to FIGS. 5A and 5B. FIGS. 5A and 5B are views showing states in which the mark AM formed on a scribe line on the wafer W is observed by the scope SC. FIG. 5A schematically illustrates an observation field region in a case where the mark AM whose X- and Y-direction positions can simultaneously be measured is observed at a high magnification. FIG. 5B schematically illustrates an observation field region in a case where the same mark AM is observed at a low magnification.

Figure 6:
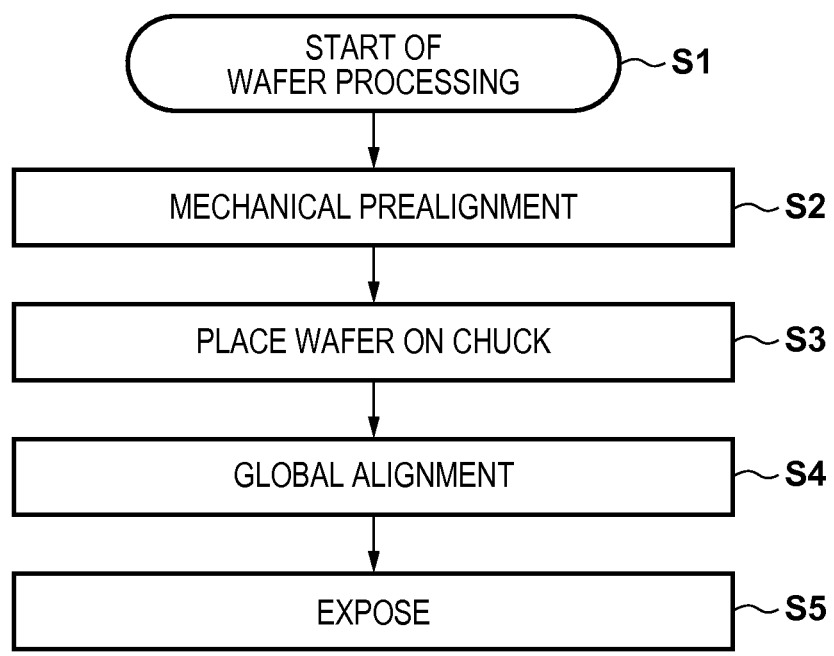
FIG. 6 is a flowchart of lithography processing.

The arrangement of the exposure apparatus including an alignment mechanism and the outline of the operation of the alignment mechanism will be described next with reference to the flowchart of FIG. 6. When the wafer W is supplied to the exposure apparatus, the main controller MC controls a mechanical alignment unit (alignment unit) MA in step S2 so as to detect the periphery and a notch (orientation flat or notch N) of the wafer W, decide the rough position of the wafer W, and mechanically align it. In step S3, the main controller MC controls a wafer feeder WF so as to convey the wafer W aligned by the mechanical alignment unit MA from the mechanical alignment unit MA to a chuck CH on the stage STG. The wafer W conveyed by the wafer feeder (conveying unit) WF is held on the stage STG and is movable with respect to the image sensor S in this state. In step S4, the main controller MC performs global alignment measurement processing to obtain the position of each shot region. In step S5, the main controller MC positions each shot region to the position obtained in step S4 and performs exposure processing in each shot region.

[Global Alignment Processing]

The global alignment processing of step S4 will be described next with reference to the flowcharts of FIGS. 7 and 8.

First Embodiment

Figure 7:
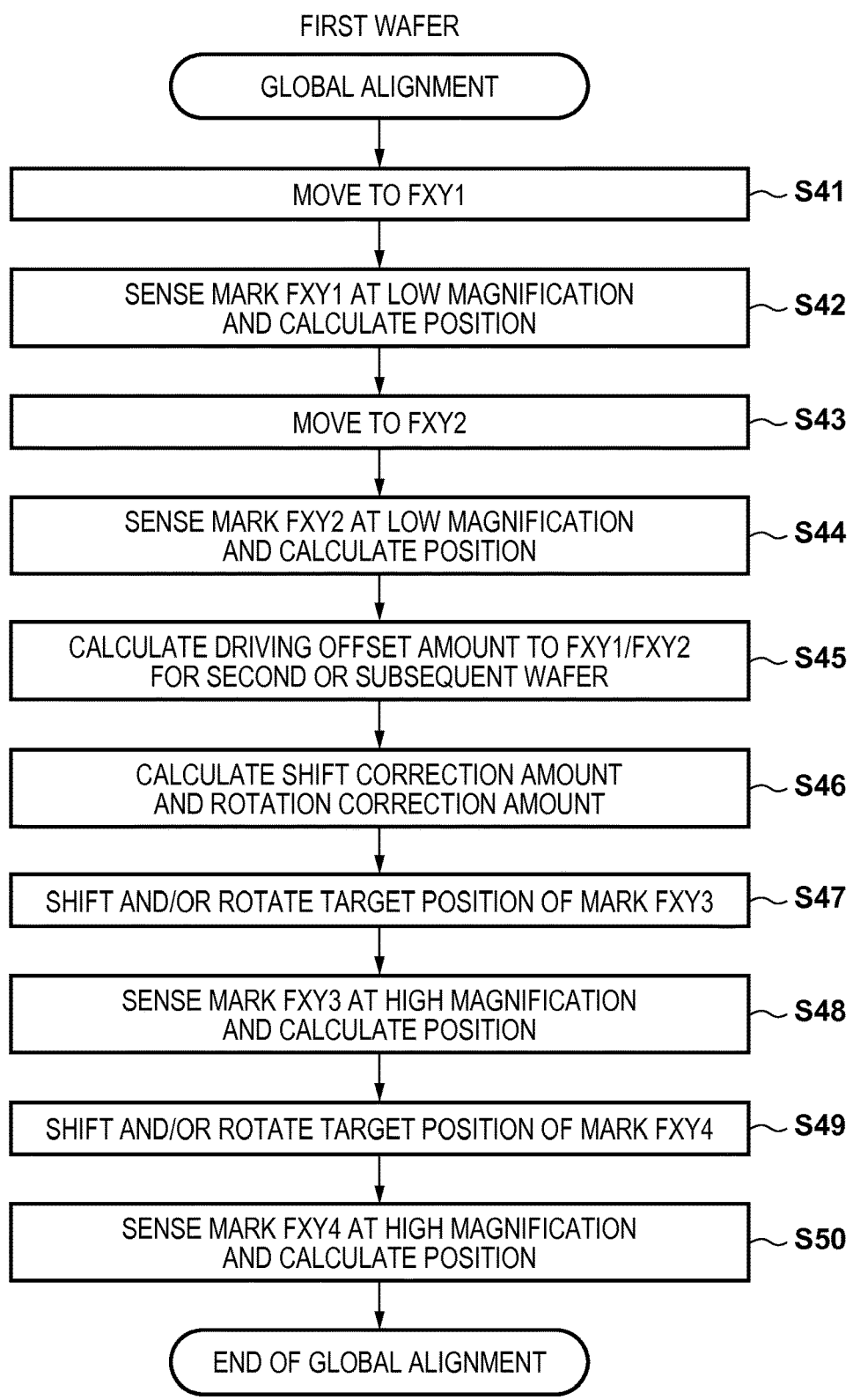
FIG. 7 is a flowchart showing global alignment measurement processing for a first substrate.
Figure 8:
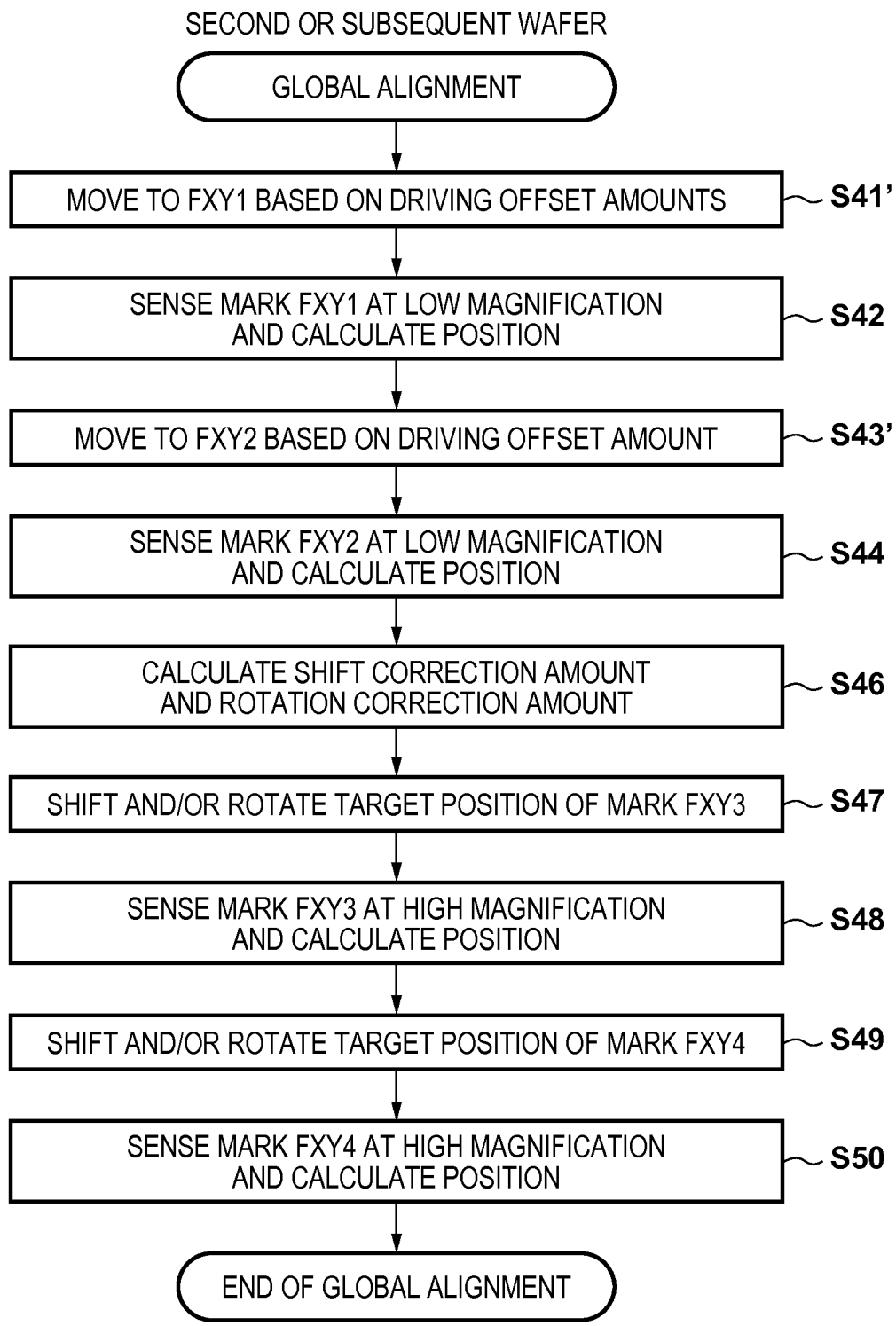
FIG. 8 is a flowchart showing global alignment measurement processing for a second or subsequent substrate.

FIG. 7 shows global alignment processing for a first wafer W of a lot. FIG. 8 shows global alignment processing for the second or subsequent wafer W of the lot. As shown in FIG. 7, in the global alignment processing for the first wafer (second substrate) W of the lot, a main controller MC moves a stage STG to locate a scope SC at a position capable of observing a first mark FXY1 (second mark) in step S41. In step S42, the scope SC detects the mark FXY1 at a low magnification. At this time, image sensing at the low magnification is done with a preset accumulation time or an accumulation time used for the wafer W that has undergone exposure processing before. A processor P determines the light amount and ensures the light amount necessary for the measurement. If the necessary light amount cannot be ensured as the result of determination, the accumulation time is set again, the image of the mark FXY1 is sensed again, and the deviation amount of the mark FXY1 with respect to the center of the image sensing screen is calculated. Note that in this embodiment, prealignment measurement using image sensing at the low magnification is executed only for two marks FXY1 and FXY2 shown in FIG. 3.

In step S43, the main controller MC moves the stage STG to locate the scope SC at a position capable of observing the second mark FXY2 (second mark). In step S44, the main controller MC executes low magnification measurement for the second mark FXY2, like the measurement of the first mark FXY1, thereby obtaining the mark deviation amounts (X and Y directions) with respect to the center of the image sensing screen. In step S45, the processor P obtains the relative driving amounts (offset amounts) of the mark FXY1 with respect to the scope SC such that the distance from the row to start readout of the data of the entire image sensing region to the row to start readout of the data of the region portion (first region) of the mark FXY1 falls within a predetermined distance. In step S45, the processor P provides offset amounts for the mark FXY2 as well. The offset amounts of the marks FXY1 and FXY2 obtained in step S45 are used to position the marks FXY1 and FXY2 on the wafer W when performing low magnification image sensing of the marks FXY1 and FXY2 from the second wafer (first substrate) W.

In step S46, the processor P calculates a correction amount including the shift component, rotation component, and magnification component of the position deviation of the wafer W from the X- and Y-direction positions of the marks FXY1 and FXY2 obtained in steps S42 and S44. The shift component and the rotation component are position deviation amounts when the wafer W is placed on a chuck CH. The magnification component is the stretch amount of the shot pattern on the wafer W. In a case where the correction amount is large, even if the stage STG is moved such that the scope SC can observe the third or subsequent mark, the mark cannot be moved to a position immediately under the scope SC. To prevent this, the processor P calculates the deviation between the shot layout on the wafer W and the stage coordinate system based on the correction amount. That is, step S46 is equivalent to obtaining a minute correction amount when aligning a grid on the wafer with a grid on the stage.

In step S47, the main controller MC drives the stage STG so as to drive a third mark FXY3 to the target position, that is, into the field of vision of the high magnification detection system based on the correction amount obtained in step S46. In step S48, the processor P calculates the position of the third mark FXY3. In step S49, the main controller MC drives a fourth mark FXY4 into the field of vision of the high magnification detection system. In step S50, the processor P calculates the position of the fourth mark FXY4. The processor P calculates the position of each shot region on the wafer W based on the positions of the third mark FXY3 and the fourth mark FXY4 detected by high magnification image sensing.

In this embodiment, low magnification image sensing is performed for the two marks FXY1 and FXY2, thereby obtaining the correction amount including the shift component, rotation component, and magnification component of the position deviation of the wafer W. However, the number of marks to be sensed at the low magnification is not limited to two, and may be one or three or more. If the number of marks to be sensed at the low magnification is one, however, only the shift component is obtained as the correction amount in step S46, and the rotation component and the magnification component cannot be obtained. In this embodiment, high magnification image sensing is performed for two marks. However, the number of marks to be sensed at the high magnification may be three or more. In this embodiment, the marks to be sensed at the high magnification are different from the marks to be sensed at the low magnification. However, the marks to be sensed at the high magnification may include the marks to be sensed at the low magnification.

Global alignment processing for the second or subsequent wafer W of the lot will be described with reference to FIG. 8. Steps S42, S44, and S46 to S50 in FIG. 8 are the same as steps S42, S44, and S46 to S50 in FIG. 7. FIG. 8 is different from FIG. 7 in that step S45 can be omitted in FIG. 8, and steps S41 and S43 in FIG. 7 change to steps S41' and S43' in FIG. 8. Referring to FIG. 8, in step S41', the main controller MC drives the stage STG based on the offset amounts obtained in step S45 for the first wafer such that the time from the start of readout of the data of the image sensing region to the start of readout of the data of the region of the mark FXY1 falls within a predetermined time.

Figure 9:
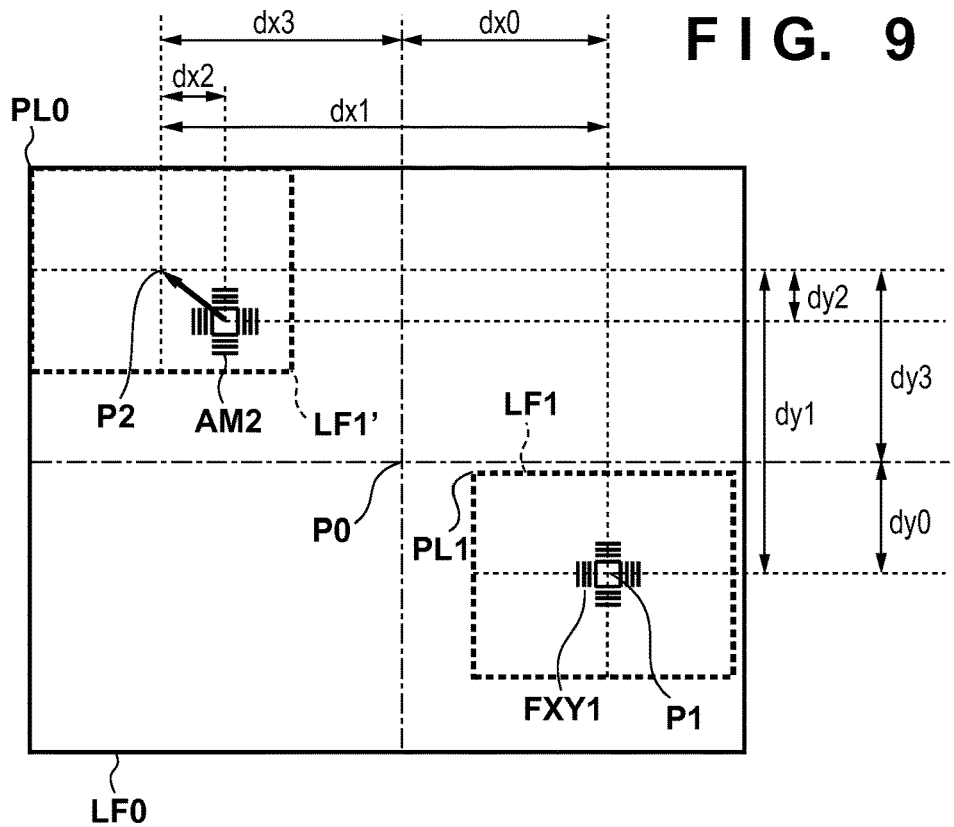
FIG. 9 is a view showing a state in which the alignment mark is observed at a low magnification.

In the exposure processing, when sensing a mark on the first wafer of the lot, the region where the mark FXY1 exists cannot be specified in advance at the time of alignment processing because of exposure errors between apparatuses that have previously exposed layers as well as the feed error of a mechanical alignment unit MA. Hence, the feed target of mark feed driving in step S41 for the first wafer is set to a center P0 of the image sensing region of an image sensor S in mark position calculation of step S42. In the low magnification image sensing of steps S42 and S44, an entire image sensing region LF0 shown in FIG. 9 is sensed, and the deviation amounts (dx0, dy0) of the mark FXY1 with respect to the center P0 of the image sensing region are obtained. The feed positions (dx0', dy0') of the second or subsequent wafer are given by $$dx0'=dx\text{Ma}+dx\text{STG}+dx\text{PrevExp} \quad (1)$$

$$dy0'=dy\text{Ma}+dy\text{STG}+dy\text{PrevExp} \quad (2)$$

where (dxMA, dyMa) are the feed errors of the mechanical alignment unit MA, (dxSTG, dySTG) are the driving errors of the stage STG, and (dxPrevExp, dyPrevExp) are the exposure errors between apparatuses that have previously exposed layers.

The driving errors of the stage STG are much smaller than the feed errors of the mechanical alignment unit MA. The exposure errors between the apparatuses are the differences between the feed targets of the apparatuses and can be regarded as fixed values in the same lot. As for the feed position of the second or subsequent wafer, assume that a mark AM1 is measured at a position P1 in the first wafer of the lot. The mark AM1 in the second or subsequent wafer of the lot exists within the range of a mark region LF1 decided based on the feed error range of the mechanical alignment unit with respect to the position P1 as the center and a size defined by the mark shape.

Figure 10:
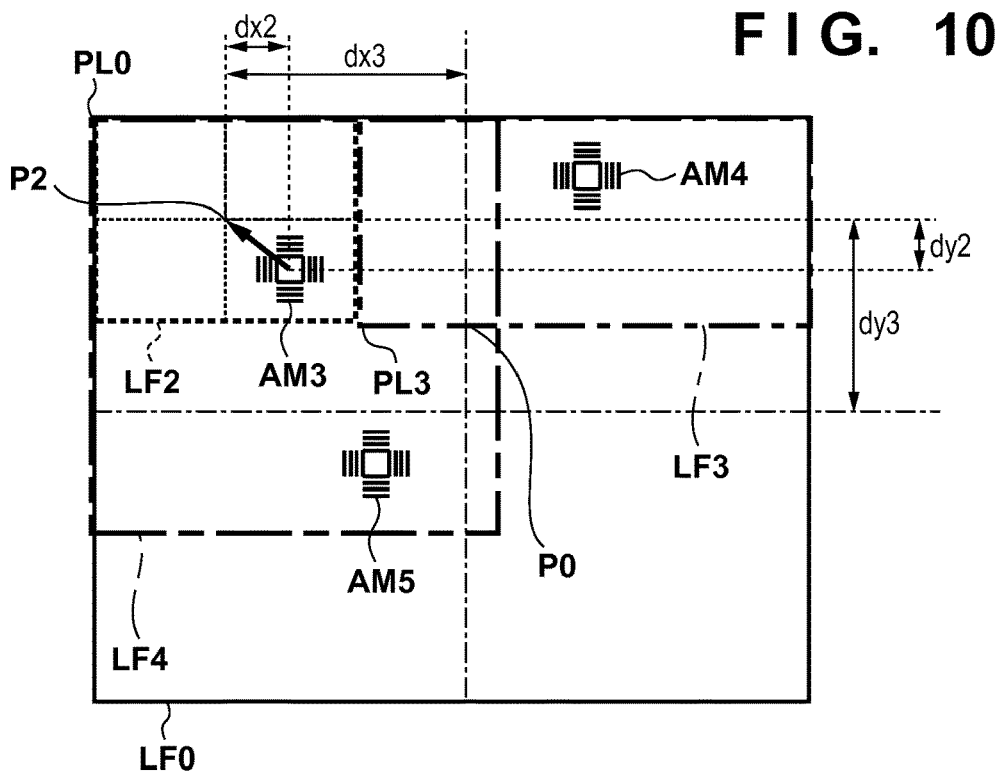
FIG. 10 is a view showing a state in which the alignment mark is observed at a low magnification.

On the other hand, the image sensor S generally sequentially transfers the image in the horizontal direction from an image sensing starting point PL0 at the upper left corner of the image sensing region shown in FIG. 10, and after completing the transfer up to the end, moves to the next line, and similarly transfers the image. That is, since the mark region (first region) necessary for mark position measurement is located close to the image transfer starting point (readout starting point), the process can advance to processing of calculating the mark position without waiting for completion of transfer of data of the entire image sensing region LF0 by the image sensor.

In this embodiment, in step S41' of the global alignment processing for the second or subsequent wafer of the lot, the main controller MC aligns the mark region LF1 obtained from the mark measurement result of the first wafer with a region LF1' at the upper left corner of the image sensor so as to minimize the transfer time. In step S41', the main controller MC also drives the stage STG based on offset amounts that change the feed position of the mark FXY1 from P1 (dx0, dy0) to P2 (dx3, dy3). The offset amounts to feed the center of the mark FXY1 to the position P2 are decided in the following way. In the second or subsequent wafer, the mark is fed such that its center is always located near P1 if driving of the stage STG is not corrected based on the offset amounts. Hence, the offset amounts of the stage STG used to drive the center of the mark to the position P0 are given by $$\text{STGOff}x0=-dx0 \quad (3)$$

$$\text{STGOff}y0=-dy0 \quad (4)$$

In addition, the offset amounts of the stage STG used to drive the center of the mark to the position P2 are given by $$STGOffx2 = dx3 - dx0 \quad (5)$$

$$STGOffy2 = dy3 - dy0 \quad (6)$$

The center of the mark on the second or subsequent wafer W is located at a position shifted from the center P0 of the image sensing region by (dx3, dy3). The image obtaining range is LF1' that is the same as LF1 decided based on the size defined by the mark shape and the error range of the mechanical alignment unit. When the central position P2 of the mark, the position LF1' of the mark region, and the feed position of the stage STG are changed in the above-described way, processing of measuring the position of the mark starts at the same time as the end of transfer of image data of the region LF1'. As a result, the image transfer time and, in turn, the mark position measurement time are shortened.

In this embodiment, the offset amounts used in step S41' of global alignment processing for the wafer W whose exposure order in the lot is the second or subsequent are decided based on the measurement result in alignment processing of the wafer W whose exposure order in the lot is the first. However, for the offset amounts used in step S41', the measurement result of the wafer W that has undergone the global alignment processing before the wafer that uses the offset amounts can be used. For example, for the offset amounts used in step S41', the measurement result of the wafer W that has undergone the global alignment processing immediately before the wafer that uses the offset amounts can be used.

Second Embodiment

The second embodiment of global alignment processing will be described with reference to FIG. 10. Referring to FIG. 10, it is assumed in the first embodiment that the position of the mark region is fed to LF2, and measurement of the mark position is started after completion of transfer of the image of the region LF2 to shorten the time of position measurement of the mark observed at a low magnification on the second or subsequent wafer of a lot. As for image transfer, an image sensor S sequentially transfers the image in the horizontal direction from an image sensing starting point PL0 at the upper left corner of an image sensing region LF0 shown in FIG. 10, and after completing the transfer up to the right end, moves to the next line, and similarly performs transfer. That is, almost as the same time as a mark region LF2 necessary for mark position measurement is transferred to a processor P, the image of a region LF3 extended rightward from LF2 is transferred to the processor P as well.

As described above, if wafers are different, the position of the mark on the first wafer and the position of the mark on the second or subsequent wafer do not necessarily match because of the feed error of a mechanical alignment unit MA or the driving error of a stage STG. Hence, although a mark AM3 on the second or subsequent wafer exists in the region LF2 at a high possibility, it may exist outside the region LF2. Hence, if the mark cannot be found in the region LF2 because of a factor such as the feed error of the mechanical alignment unit MA, it is confirmed whether the image of the mark exists in a region LF3 except LF2 out of the region that has already undergone the transfer. If the mark is detected in the region LF3, mark position measurement can be performed without largely increasing the measurement time. In this case, since the measurement processing region is wider than LF2, the image processing time increases. However, since image sensing and image transfer need not be performed again for the mark existing in the region LF3, mark position calculation processing can be performed within a minimum necessary time. In this case, measurement processing for the next wafer can be performed by changing offset amounts based on the position of the mark (the position of a mark AM4) that existed in the region LF3.

Third Embodiment

The third embodiment of global alignment processing will be described with reference to FIG. 10. In the third embodiment, after the end of readout of the data of a region LF2, an image of an entire image sensing region LF0 is transferred in parallel to processing of the data of the mark region (first region) LF2. Accordingly, if no mark can be observed in the region LF2 or LF3, measurement processing can be performed in a region except the region LF2 (or LF3) out of the entire image sensing region LF0. That is, if the mark cannot be found in the region LF2 (or LF3), mark position calculation processing can be performed without performing image sensing again. In this case, measurement processing for the next wafer (another substrate) can be performed by changing offset amounts based on the position of the mark (the position of a mark AM5) that existed in the region LF3.

[Article Manufacturing Method]

An article manufacturing method according to an embodiment of the present invention is usable to manufacture an article, for example, a microdevice such as a semiconductor device or an element having a microstructure. The article manufacturing method according to this embodiment includes a step of forming a pattern (latent image pattern) on a resist applied to a substrate using a lithography apparatus, and a step of developing (processing) the substrate with the pattern formed in the step. The manufacturing method can also include other known steps (oxidation, deposition, vapor deposition, doping, planarization, etching, resist removal, dicing, bonding, and packaging). The article manufacturing method according to this embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-234000, filed Nov. 18, 2014, which is hereby incorporated by reference herein in its entirety.

What is claimed is:

1. A lithography apparatus for forming a pattern on a substrate, the apparatus comprising:
    a stage configured to move while holding the substrate on which a mark is formed;
    a scope configured to capture an image of the mark on the substrate, the scope including an image sensor having an image sensing region where a plurality of pixels are arranged in matrix, and an imaging optical system for adjusting magnification;
    a processor configured to read data of an image of the mark formed in the image sensing region sequentially on a row basis and process the read data, and obtain a position of the mark formed on the substrate; and
    a controller configured to position the substrate by moving the stage based on the position of the mark and form the pattern on the substrate,
    wherein, for capturing an image of a first mark on a first substrate by the scope, the controller moves the stage holding the first substrate by a predetermined offset amount with respect to the image sensor so that, in the image sensing region, the image of the first mark is disposed closer to a row in the image sensing region, from which the processor starts reading the data, than an image of a second mark on a second substrate different from the first substrate when the scope has captured the image of the second mark, wherein the predetermined offset amount is based on a position of the image of the second mark in the image sensing region formed for obtaining a position of the second mark on the second substrate, and wherein the controller is configured to set the magnification to a first magnification for capturing the image of the first mark and the image of the second mark.

2. The apparatus according to claim 1, wherein when reading of data of a first region as a data processing target out of the image sensing region has ended, the processor starts processing the data from the first region without waiting for reading of all rows of the image sensing region.

3. The apparatus according to claim 2, wherein in a case where data of the image of the first mark cannot be found in the data from the first region, the processor confirms whether the data of the image of the first mark exists in data from a region except the first region out of a region that has undergone reading.

4. The apparatus according to claim 2, wherein:

after reading of data of the first region has ended, the processor reads data of a remaining region following the first region in parallel to the processing of the data from the first region, and in a case where data of the image of the first mark cannot be found in the data from the first region, the processor confirms whether the data of the image of the first mark exists in the data from the remaining region.

5. The apparatus according to claim 3, wherein in a case where the image of the first mark exists in data from another region different from the first region, when detecting a position of a mark on another substrate on which the pattern is to be formed after the first substrate, the controller controls movement of the stage based on a position of the image of the first mark in the image sensing region, so that an image of the mark on the other substrate is formed closer to the row to start the readout than the image of the second mark.

6. The apparatus according to claim 4, wherein in a case where the image of the first mark exists in data from another region different from the first region, when detecting a position of a mark on another substrate on which the pattern is to be formed after the first substrate, the controller controls movement of the stage based on a position of the image of the first mark in the image sensing region, so that an image of the mark on the other substrate is formed closer to the row to start the readout than the image of the second mark.

7. The apparatus according to claim 1, wherein the controller obtains a position deviation correction amount of the substrate from an image sensing result of a mark formed in at least one shot region at the first magnification, and after moving the substrate based on the position deviation correction amount, statistically processes positions of a plurality of marks obtained from an image sensing result of the marks formed in a plurality of shot regions, respectively, at a second magnification higher than the first magnification, and obtains the position of each shot region on the substrate.

8. The apparatus according to claim 1, wherein the first substrate is, from among a plurality of substrates belonging to the same lot, a substrate whose pattern formation order is the second or subsequent, and the second substrate is a substrate whose order is the first.

9. The apparatus according to claim 1, wherein the first substrate is, from among a plurality of substrates belonging to the same lot, a substrate whose pattern formation order is the second or subsequent, and the second substrate is a substrate whose order is immediately preceding to the first substrate.

10. The apparatus according to claim 1, wherein the controller controls movement of the stage based on a positioning error when positioning the substrate on the stage in addition to the position of the image of the second mark in the image sensing region.

11. The apparatus according to claim 1, further comprising:

an alignment unit configured to detect a notch provided in the substrate and align the substrate; and a conveying unit configured to convey the substrate, whose alignment has been undergone by the alignment unit, to the stage.

12. A method of manufacturing an article, the method comprising the steps of:

forming a pattern on a substrate using a lithography apparatus; and processing the substrate, on which the pattern has been formed, to manufacture the article, the lithography apparatus comprising:

a stage configured to move while holding the substrate on which a mark is formed;

a scope configured to capture an image of the mark on the substrate, the scope including an image sensor having an image sensing region where a plurality of pixels are arranged in matrix, and an imaging optical system for adjusting magnification;

a processor configured to read data of an image of the mark formed in the image sensing region sequentially on a row basis and process the read data, and obtain a position of the mark formed on the substrate; and a controller configured to position the substrate by moving the stage based on the position of the mark and form the pattern on the substrate, wherein, for capturing an image of a first mark on a first substrate by the scope, the controller moves the stage holding the first substrate by a predetermined offset amount with respect to the image sensor so that, in the image sensing region, the image of the first mark is disposed closer to a row in the image sensing region, from which the processor starts reading the data, than an image of a second mark on a second substrate different from the first substrate when the scope has captured the image of the second mark, wherein the predetermined offset amount is based on a position of the image of the second mark in the image sensing region formed for obtaining a position of the second mark on the second substrate, and wherein the controller is configured to set the magnification to a first magnification for capturing the image of the first mark and the image of the second mark.

* * * * *